(12) United States Patent
Tseng et al.

(10) Patent No.: US 9,437,321 B2
(45) Date of Patent: Sep. 6, 2016

(54) ERROR DETECTION METHOD

(71) Applicant: SANDISK TECHNOLOGIES INC., Plano, TX (US)

(72) Inventors: Huai-Yuan Tseng, San Ramon, CA (US); Deepanshu Dutta, Fremont, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/525,813

(22) Filed: Oct. 28, 2014

(65) Prior Publication Data

US 2016/0118136 A1  Apr. 28, 2016

(51) Int. Cl.
*G11C 16/34* (2006.01)
*G11C 11/56* (2006.01)

(52) U.S. Cl.
CPC ......... *G11C 16/3495* (2013.01); *G11C 16/349* (2013.01); *G11C 16/3422* (2013.01); *G11C 11/5635* (2013.01)

(58) Field of Classification Search
CPC ............ G11C 16/3495; G11C 16/349; G11C 16/3422
See application file for complete search history.

(56) References Cited

U.S. PATENT DOCUMENTS

| | | |
|---|---|---|
| 5,465,233 A | 11/1995 | Slemmer |
| 6,111,799 A | 8/2000 | Uchida |
| 6,781,902 B2 | 8/2004 | Oumiya |
| 7,257,038 B2 | 8/2007 | Killian |
| 7,400,531 B2 * | 7/2008 | Ohtake ............ G11C 29/50012 365/185.11 |
| 7,440,347 B1 | 10/2008 | Vogelsang |
| 7,900,102 B2 * | 3/2011 | Sokolov .............. G06F 11/1072 714/719 |
| 7,965,577 B2 | 6/2011 | Chen |
| 8,305,807 B2 | 11/2012 | Shah |
| 8,379,454 B2 | 2/2013 | Kochar |
| 8,400,854 B2 * | 3/2013 | Pei ..................... G11C 16/3418 365/184 |
| 8,432,732 B2 | 4/2013 | Li |
| 8,630,118 B2 | 1/2014 | Sakai |
| 8,730,722 B2 | 5/2014 | Koh |
| 8,775,901 B2 | 7/2014 | Sharon |
| 8,964,480 B2 | 2/2015 | Mui |
| 9,009,568 B2 | 4/2015 | Luo |
| 9,026,757 B2 | 5/2015 | Li |
| 9,065,481 B2 | 6/2015 | Meaney |
| 9,135,989 B2 | 9/2015 | Sakai |
| 2009/0094482 A1 | 4/2009 | Zilberman |
| 2011/0063918 A1 | 3/2011 | Pei |
| 2011/0096601 A1 | 4/2011 | Gavens |
| 2011/0099418 A1 | 4/2011 | Chen |

(Continued)

*Primary Examiner* — Vanthu Nguyen
(74) *Attorney, Agent, or Firm* — Vierra Magen Marcus LLP

(57) ABSTRACT

Methods for detecting and correcting defects in a memory array during a memory operation are described. The memory operation may comprise a programming operation or an erase operation. In some cases, a Control Gate Short to Substrate (CGSS) defect, in which a control gate of a NAND memory has been shorted to the substrate, may have a defect signature in which a word line shows a deviation in the number of programming loop counts associated with programming data into memory cells connected to the word line. The deviation in the number of programming loop counts may be detected by comparing a baseline programming loop count (e.g., derived from programming a set of one or more word lines prior to programming the word line with the CGSS defect) with a programming loop count associated with programming the word line with the CGSS defect.

20 Claims, 11 Drawing Sheets

(56) References Cited

U.S. PATENT DOCUMENTS

| | | |
|---|---|---|
| 2011/0099460 A1 | 4/2011 | Dusija |
| 2012/0008384 A1 | 1/2012 | Li |
| 2012/0008410 A1 | 1/2012 | Huynh |
| 2012/0281479 A1* | 11/2012 | Kochar .............. G11C 16/3459 365/185.19 |
| 2013/0128665 A1 | 5/2013 | Mokhlesi |
| 2014/0215128 A1* | 7/2014 | Chin .................. G11C 11/5628 711/103 |
| 2014/0226417 A1 | 8/2014 | Lai |
| 2014/0269071 A1 | 9/2014 | Pandya |
| 2015/0006976 A1 | 1/2015 | Jeon |
| 2015/0063030 A1* | 3/2015 | Park ........................ G11C 8/08 365/185.12 |
| 2015/0085575 A1 | 3/2015 | Tam |
| 2015/0301885 A1 | 10/2015 | Yuan |

* cited by examiner

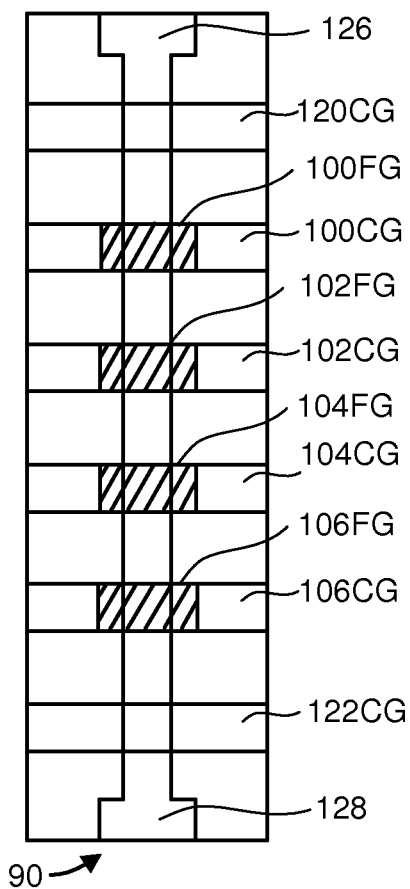 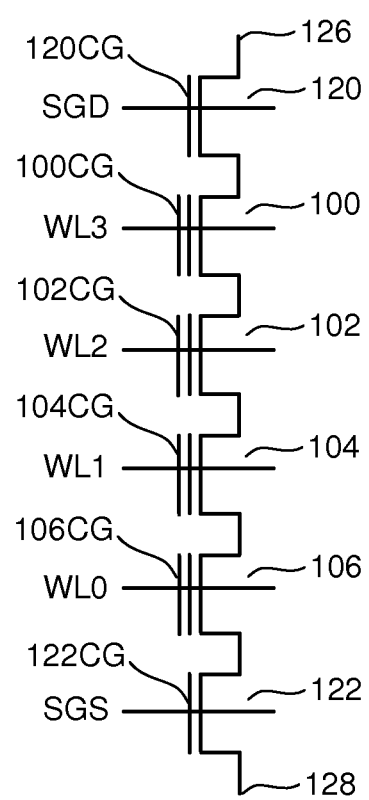
FIG. 2A  FIG. 2B

ERROR DETECTION METHOD

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim tunneling or hot-electron injection. The ability to adjust the threshold voltage allows a floating-gate transistor to act as a non-volatile storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates may be referred to as a NAND string. In recent years, NAND flash memory has been scaled in order to reduce cost per bit. However, as process geometries shrink, many design and process challenges are presented. These challenges include increased difficulty with manufacturing defects, such as word line defects.

BRIEF DESCRIPTION OF THE DRAWINGS

FIG. 2A depicts one embodiment of a NAND string.

FIG. 2B depicts one embodiment of the NAND string of FIG. 2A using a corresponding circuit diagram.

DETAILED DESCRIPTION

Figure 1A:
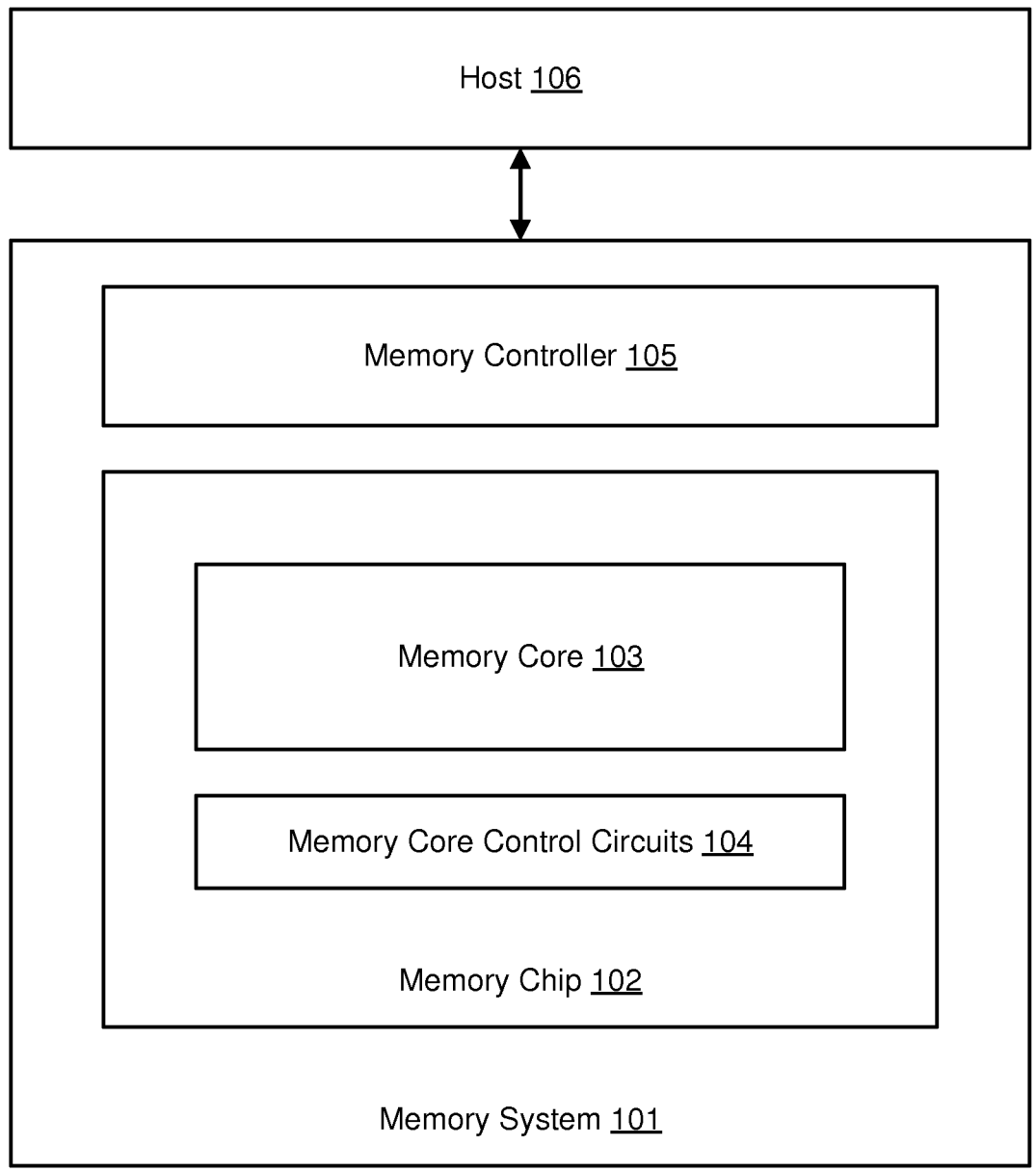
FIG. 1A depicts one embodiment of a memory system and a host.

Technology is described for detecting and correcting defects in a memory array during a memory operation. The memory operation may comprise a programming operation or an erase operation. The memory array may comprise a NAND memory array, a 3D NAND memory array (e.g., a bit cost scalable (BiCS) NAND structure), or a three-dimensional memory array (e.g., a 3D ReRAM memory array). In some embodiments, a particular defect in the memory array may manifest itself as a data programming deviation or abnormality with a particular defect signature. The data programming deviation may be detected during a programming operation in the field (e.g., after a product has been shipped to a customer and is in use by the customer) or during test (e.g., prior to customer shipment).

In one example, a Control Gate Short to Substrate (CGSS) defect, in which a control gate of a NAND memory has been shorted to the substrate, may have a signature in which a word line shows a deviation in the number of programming loop counts associated with programming data into memory cells connected to the word line. The programming loop count may refer to a number of program/verify cycles that are required to program the data into the memory cells connected to the word line. The deviation in the number of programming loop counts may be detected by comparing a baseline programming loop count (e.g., derived from programming a set of one or more word lines prior to programming the word line with the CGSS defect) with a programming loop count associated with programming the word line with the CGSS defect. In this case, the programming loop count associated with programming the word line with the CGSS defect may be less than a maximum programming loop count for detecting a hard word line failure and therefore the programming of the word line with the CGSS defect may be completed without an error being generated due to the maximum programming loop count being exceeded.

In another example, a word line to word line short defect (e.g., where two adjacent word lines are "weakly" connected to each other due to a manufacturing defect) may manifest itself as a deviation in the number of programming and verify cycles required to program a particular word line. In this case, the deviation in the number of programming and verify cycles required to program the particular word line may be detected by comparing an average programming loop count for programming a first set of word lines with the programming loop count for programming the particular word line. If the programming loop count for the particular word line exceeds the average programming loop count by at least a threshold number of programming loops (e.g., the programming loop count exceeds the average programming loop count by at least five programming loops), then a deviation may be detected. The threshold number may be set and/or adjusted such that normal programming loop variation will not be detected as defects. In some cases, the threshold number of programming loops may be set or adjusted on a per memory block basis, a per memory array basis, or a per memory die basis. The threshold number of programming loops may also be adjusted over time based on a number of programming and/or erase cycles that have occurred to the first set of word lines. Once a deviation in the number of programming loops required to program the particular word line has been detected, then the particular word line may be marked as a defective word line and the data being programmed into the particular word line may be remapped or redirected to a different word line.

In some cases, a defect associated with a word line in a memory array may be detected even though a maximum programming loop count has not been exceeded. In one example, if the maximum programming loop count comprises 12 program/verify cycles and a baseline programming loop count is determined to be 4.5 program/verify cycles based on programming data to one or more word lines prior to programming data to a particular word line, then a deviation in the baseline programming loop count may be detected (even if the maximum programming loop count has not been exceeded) if the number of programming loops required to program data into the particular word line exceeds the baseline programming loop count by more than a particular threshold number of programming loops (e.g., the particular word line may require more than three additional program/verify cycles than the baseline programming loop count).

In one embodiment, a baseline programming loop count may be determined by calculating an average programming loop count for a set of one or more word lines. In one example, the set of one or more word lines may comprise a previous word line into which data was programmed or a set of four word lines into which data was programmed. In another example, the set of one or more word lines may comprise a set of odd word lines (or odd numbered word lines) into which data was programmed or a set of even word lines (or even numbered word lines) into which data was programmed. In some cases, a first set of word lines (e.g., odd word lines) may be driven by a first set of word line drivers located on a first side of a memory array and a second set of word lines (e.g. even word lines) may be driven by a second set of word line drivers located on a second side of the memory array. The first set of word lines may be interdigitated with the second set of word lines.

In one embodiment, a memory array may comprise a plurality of memory zones. Each zone of the plurality of memory zones may correspond with a region within the memory array associated with one or more word lines. In some cases, if a deviation in the number of program/verify cycles associated with a zone is detected, then the data being programmed into the zone may be mapped to a different zone. In some cases, if a deviation in the number of erase/verify cycles associated with a zone is detected, then the memory array may be flagged as being defective (e.g., the memory array may be added to a bad block list that prevents the memory array from being enabled or used for storing data in the future).

In some cases, a defect associated with a memory array may be detected even though a maximum erase loop count has not been exceeded. In one example, if the maximum erase loop count comprises 15 erase/verify cycles and a baseline erase loop count is determined to be 7 erase/verify cycles based on erasing one or more zones (e.g., each zone may be associated with a plurality of word lines) prior to erasing a particular zone, then a deviation in the baseline erase loop count may be detected (even if the maximum erase loop count has not been exceeded) if the number of erase/verify cycles required to erase the memory cells within the particular zone exceeds the baseline erase loop count by more than a particular threshold number of erase/verify cycles (e.g., the particular zone may require more than five additional erase/verify cycles more than the baseline erase loop count). An erase loop count may refer to a number of erase/verify cycles that are required to erase memory cells associated with a zone within a memory array.

In some cases, word line abnormalities or defects, such as CGSS or word line to word line shorts, may manifest themselves as unusually high programming loop counts without triggering a programming failure (e.g., programming may complete without exceeding a maximum programming loop count). In some cases, memory block abnormalities or defects may manifest themselves in unusually high erase loop counts without triggering an erase failure (e.g., erase may complete without exceeding a maximum erase loop count).

The benefits of detecting deviations in the number of programming loops required to program data into a particular word line and/or detecting deviations in the number of erase loops required to erase a zone within a memory array include the ability to detect and correct low Defects Per Million (DPM) defects that may not be detected during wafer sort, die sort, or after packaging. The benefits also include the ability to detect and correct low DPM defects that were not caught during test in the field after a product has been shipped to a customer. Another benefit of detecting and correcting low DPM defects includes improved reliability of a non-volatile memory.

In some embodiments, word line defects may comprise initial defects that are formed during manufacturing of a NAND flash memory (e.g., word line short or open defects). In this case, the word line defects may be identified during testing and sorting of NAND flash die (e.g., during wafer sort or die sort). In some embodiments, word line defects may comprise acquired or grown defects that occur after a memory device has been manufactured. For example, memory cell characteristics of memory cells corresponding with a word line may shift or change over time as a function of the number of times that the memory cells are erased and reprogrammed. To account for memory cell and memory block failures that occur during operation of a memory device, the memory device may include a number of spare blocks (or extra blocks). The spare blocks may be used as binary cache blocks, update blocks, or multi-level cell (MLC) blocks. An update block may be used as an initial storage location for data to be written to a NAND flash memory device. An update block may comprise a sequential update block (i.e., where data is managed sequentially) or a non-sequential update block (i.e., a chaotic update block).

In some embodiments, a memory array may comprise a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a resistance-switching material, such as a phase change material, a ferroelectric material, or a metal oxide (e.g., nickel oxide or hafnium oxide). In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) devices.

FIG. 1A depicts one embodiment of a memory system 101 and a host 106. The host 106 may comprise a computing device (e.g., a personal computer, audio player, digital camera, or mobile computing device) or a storage device (e.g., an enterprise storage device). The memory system 101 may comprise a memory card, a flash drive, a system on a chip (SOC), or an embedded memory system. As depicted, the memory system 101 includes a memory controller 105 and a memory chip 102. In some cases, a memory system, such as memory system 101, may include more than one memory chip. The memory controller 105 may include one or more state machines, control logic, page registers, non-volatile memory, SRAM, or other circuitry for controlling the operation of memory chip 102. The one or more state machines, control logic, page registers, non-volatile memory, SRAM, and/or other circuitry for controlling the operation of the memory chip 102 may be referred to as managing or control circuits. The managing or control circuits may be used to facilitate one or more memory array operations associated with the memory chip 102 including erasing, programming, and reading operations. The memory controller 105 may receive data and commands from host 106 and provide memory chip data to host 106. In some embodiments, the memory controller 105 and memory chip 102 may be arranged on a single integrated circuit. In other embodiments, memory controller 105 and memory chip 102 may be arranged on different integrated circuits.

As depicted, the memory chip 102 includes memory core control circuits 104 and memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. The memory cells may comprise floating-gate transistors or non-volatile memory technologies that employ charge trapping, phase-change (e.g., chalcogenide materials), or state-change materials. In one embodiment, the memory core control circuits 104 and memory core 103 are arranged on a single integrated circuit. In other embodiments, the memory core control circuits 104 and memory core 103 may be arranged on different integrated circuits.

Referring to FIG. 1A, a memory system operation may be initiated when host 106 sends instructions to memory controller 105 indicating that it would like to read data from memory system 101 or write data to memory system 101. In the event of a write (or programming) operation, host 106 may send to memory controller 105 both a write command and the data to be written. The data to be written may be buffered by memory controller 105 and error correcting code (ECC) data may be generated corresponding with the data to be written. The ECC data, which allows data errors that occur during transmission or storage to be detected and/or corrected, may be written to memory core 103 or stored in non-volatile memory within memory controller 105. In one embodiment, the ECC data is generated and data errors are corrected by circuitry within memory controller 105.

In some cases, the operation of memory chip 102 may be controlled by memory controller 105. In one example, before issuing a write operation to memory chip 102, memory controller 105 may check a status register to make sure that memory chip 102 is able to accept the data to be written. In another example, before issuing a read operation to memory chip 102, memory controller 105 may pre-read overhead information associated with the data to be read. The overhead information may include ECC data associated with the data to be read or a redirection pointer to a new memory location within memory chip 102 in which to read the data requested. Once a read or write operation is initiated by memory controller 105, memory core control circuits 104 may generate the appropriate bias voltages for word lines and bit lines within memory core 103, as well as generate the appropriate memory block, row, and column addresses. The memory controller 105 may manage the translation (or mapping) of logical addresses received from the host 106 into physical addresses associated with the memory chip 102. The mapping tables for mapping the logical addresses corresponding with logical groups of data to physical address corresponding with memory locations within memory chip 102 may be stored within memory controller 105 or within memory chip 102.

In some embodiments, memory controller 105 may control one or more memory chips within a memory system. Each of the one or more memory chips may be organized into a plurality of memory blocks. In some cases, each of the one or more memory chips may be organized into a plurality of metablocks. A metablock may comprise a plurality of memory blocks. A memory block may comprise a group of memory cells that are erased concurrently (i.e., a unit of erase). In some cases, the group of memory cells may comprise a binary cache or a group of multi-level cells for storing user data. Each of the plurality of memory blocks may include a plurality of pages. A page may comprise a group of memory cells that may be accessed, programmed, and/or read concurrently. The group of memory cells within a page may share a common word line. In some cases, a memory block may comprise 32, 64, or 128 pages and each page may comprise 2 KB or 4 KB of data.

Figure 1B:
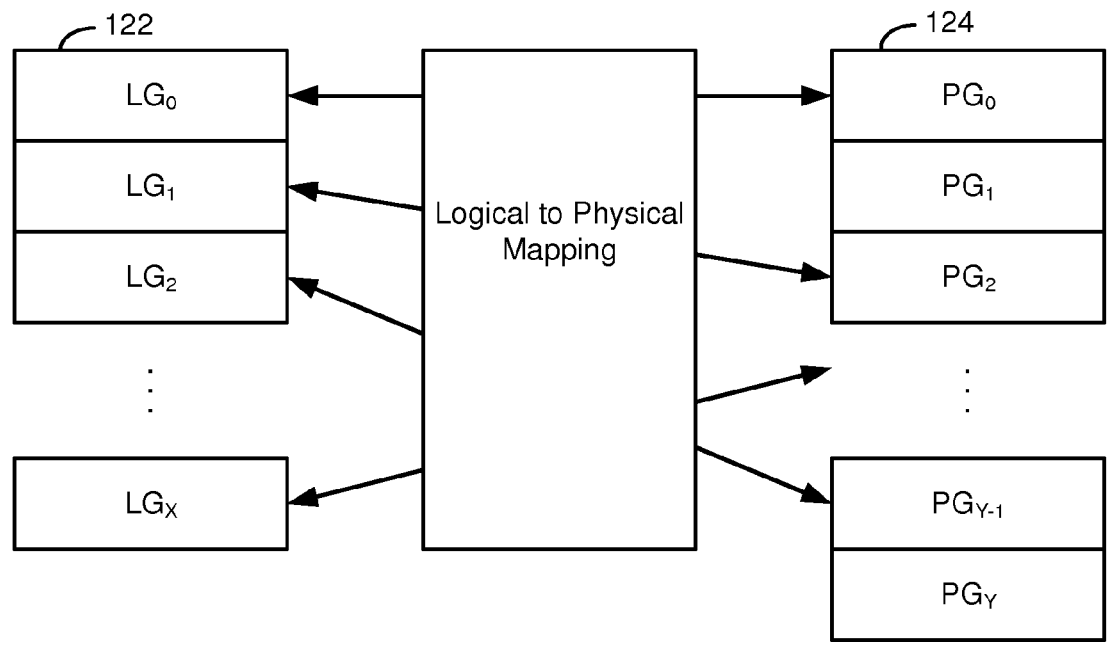
FIG. 1B depicts one embodiment of a mapping between logical groups and physical groups as performed by a memory system.

FIG. 1B depicts one embodiment of a mapping between logical groups and physical groups as performed by a memory system, such as memory system 101 in FIG. 1A. As depicted, each logical group of logical groups 122 (e.g., represented as a logical block address) is mapped to a unique physical group of physical groups 124 (e.g., represented as a memory block or page address). A logical group may be associated with a metablock, a page, or a portion of a page. In some cases, a logical group may comprise a grouping of one or more logical sectors which are mapped to a metablock. The logical to physical mapping between the logical groups and the physical groups may be stored in a table or list within a non-volatile memory, such as memory core 103 in FIG. 1A. In some cases, each logical group may be mapped to a metablock address. In one embodiment, a Group Address Table (GAT) may be used to store a mapping of metablock addresses for each logical group within a memory system.

Figure 1C:
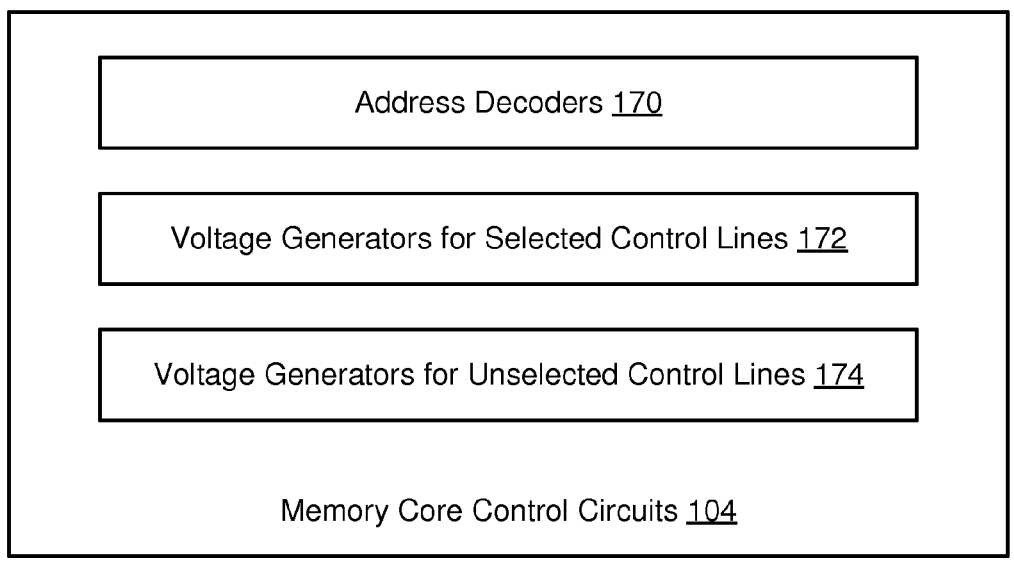
FIG. 1C depicts one embodiment of memory core control circuits.

FIG. 1C depicts one embodiment of memory core control circuits 104 in FIG. 1A. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

Figure 1D:
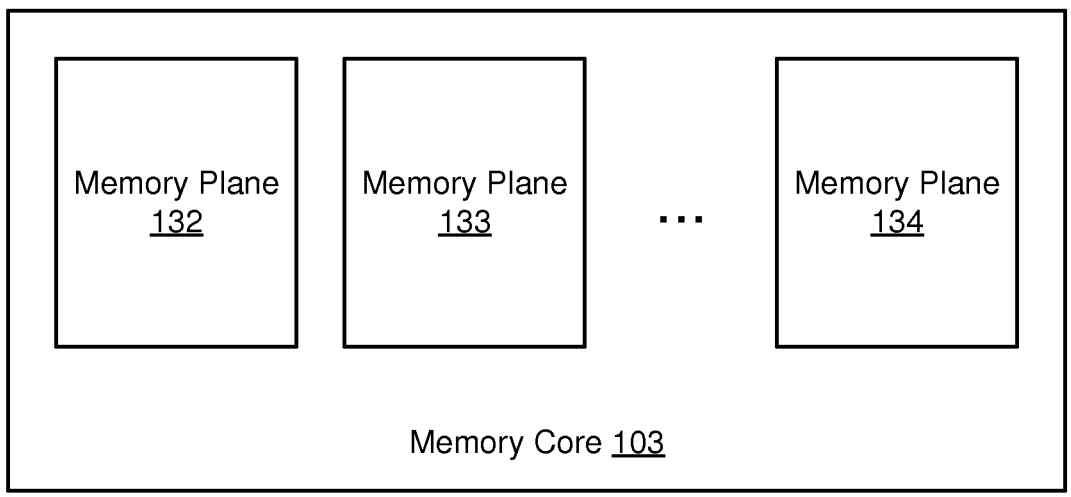
FIG. 1D depicts one embodiment of memory core.

FIG. 1D depicts one embodiment of memory core 103 in FIG. 1A. As depicted, memory core 103 includes memory planes 132-134. In some embodiments, the number of memory planes (or bays) per memory core can be different for different implementations. For example, a memory core may include only a single memory plane or a plurality of memory plane (e.g., 16 memory bays). Each memory plane may comprise one or more memory blocks. Each memory block may comprise one or more memory cells. In some cases, multiple memory planes may be operated in parallel to increase read and/or write bandwidth. Although a memory core organization is depicted where memory planes comprise memory blocks, and memory blocks comprise a group of memory cells, other organizations or groupings can also be used with the technology described herein.

Figure 1E:
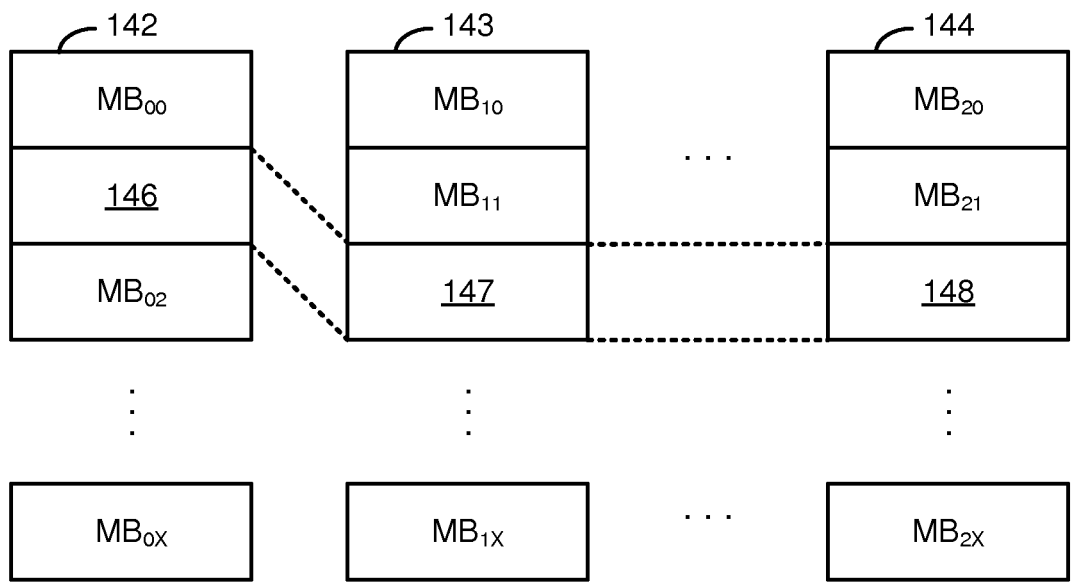
FIG. 1E depicts one embodiment of a memory core organization including a plurality of memory planes.

FIG. 1E depicts one embodiment of a memory core organization including a plurality of memory planes. The memory planes 142-144 each comprise a plurality of physical groups. Each physical group may comprise a memory block (e.g., memory block $MB_{00}$). In some cases, memory blocks across the plurality of physical groups may be linked together to form a metablock. For example, memory blocks 146-148 may be linked together to form a metablock. As depicted, the memory blocks used to form a metablock may be from various locations within their respective memory planes. For example, memory block 146 from memory plane 142, memory block 147 from memory plane 143, and memory block 148 from memory plane 144 may be linked together to form a metablock or a portion of a metablock. As each of the memory blocks may include a plurality of pages, a metapage extending across each of the memory planes 142-144 may be created by linking pages from each of the memory blocks within a metablock together. In some embodiments, a subset of the memory blocks within a memory plane may correspond with one or more spare blocks.

FIG. 2A depicts one embodiment of a NAND string 90. FIG. 2B depicts one embodiment of the NAND string of FIG. 2A using a corresponding circuit diagram. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string 90 to a bit line 126. Select gate 122 connects the NAND string 90 to a source line 128. Select gate 120 is controlled by applying the appropriate voltage to control gate 120CG (i.e., via select line SGD of FIG. 2B). Select gate 122 is controlled by applying the appropriate voltage to control gate 122CG (i.e., via select line SGS of FIG. 2B). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 2A and 2B show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND flash memory structure includes a plurality of NAND strings within a memory block. A memory block may comprise a unit of erase. In some cases, the NAND strings within a memory block may share a common well (e.g., a P-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

Although technology using NAND-type flash memory is described herein, the technology disclosed herein may also be applied to other types of non-volatile storage devices and architectures (e.g., NOR-type flash memory or three-dimensional memories). Moreover, although technology using floating-gate transistors is described herein, the technology described herein may also be applied to or used with other memory technologies including those that employ charge trapping, phase-change (e.g., chalcogenide materials), or state-change materials.

Figure 3A:
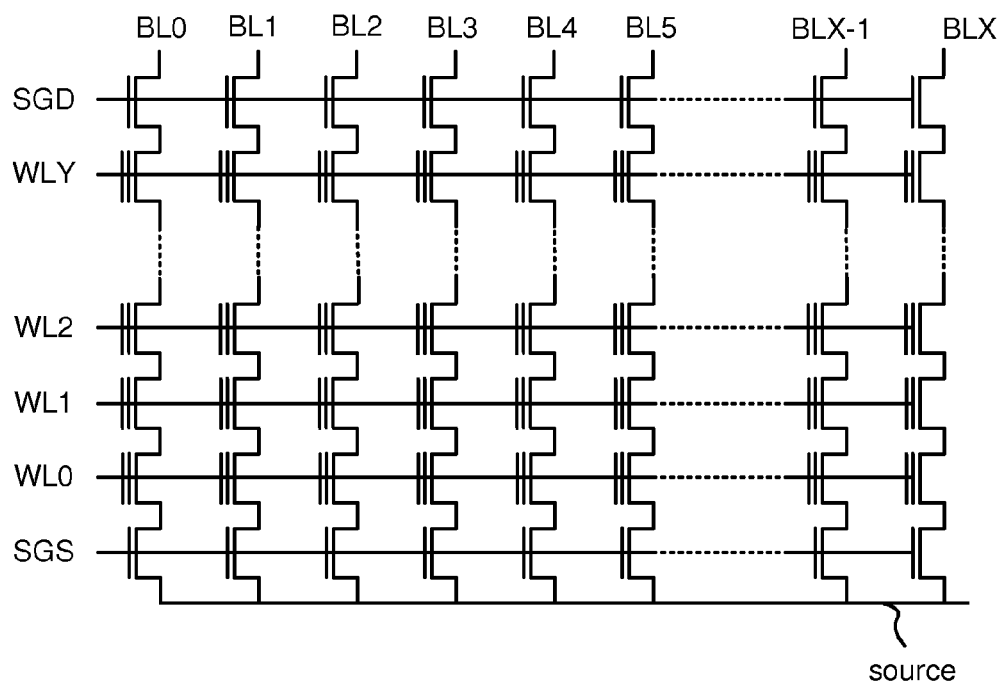
FIG. 3A depicts one embodiment of a memory block including a plurality of NAND strings.

FIG. 3A depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS.

In some embodiments, in order to save space on a semiconductor die, two adjacent NAND strings (or other grouping in memory cells) may share a common bit line (i.e., a shared-bit-line memory architecture). In some cases, more than two NAND strings may share a common bit line. In one example, the signal SGD may be replaced by two drain-side selection signals SGD1 and SGD2. Each NAND string of the pair would then have two drain-side select gates, each connected to a different drain-side selection signal of the two drain side selection signals SGD1 and SGD2. One of the two drain-side select gates for each NAND string may be a depletion mode transistor with its threshold voltage lower than 0 volts. One potential problem with using two select gates on the drain side of each NAND string is that two drain-side select gates (as compared to one drain-side select transistor) requires more area on the die. Therefore, from an integrated circuit area standpoint, it may be beneficial to only use one drain-side selection gate for each NAND string and then connect each NAND string of the pair with only one of the two drain-side selection signals.

One benefit of a shared bit line string architecture (e.g., a shared bit line string architecture comprising NAND flash memory cells or SONOS memory cells) is that it relieves the bit line pitch by 2× since pairing strings with a common bit line allows the total number of bit lines to be cut in half. The increase in bit line pitch for a given process geometry allows for less resistive bit line contacts and the reduced total number of bit lines allows for reduced bit line resistance and/or reduced bit line to bit line capacitance between adjacent bit lines. These benefits, however, come at the expense of reduced controllability of each string. For example, during a programming operation only one string of a pair of strings may be programmed via the common bit line at a particular time. More information regarding a shared bit line memory architecture using NAND flash memory cells may be found in U.S. Provisional Application 61/561,286, "Improved Operation for Non-Volatile Storage System With Shared Bit Lines Connected to Single Selection Device," U.S. Provisional Application 61/422,385, "Non-Volatile Storage System With Shared Bit Lines Connected to Single Selection Device," and U.S. patent application Ser. No. 13/429,851, "Shared-Bit-Line Bit Line Setup Scheme."

In one embodiment, when programming a memory cell, such as a NAND flash memory cell, a program voltage may be applied to the control gate of the memory cell and the corresponding bit line may be grounded. These programming bias conditions may cause electrons to be injection into the floating gate via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed. A program/verify cycle may comprise one or more programming operations followed by one or more verify operations.

In one embodiment, memory cells may be erased by raising the p-well to an erase voltage (e.g., 20 volts) for a sufficient period of time and grounding the word lines of a selected block of memory cells while the source and bit lines are floating. These erase bias conditions may cause electrons to be transferred from the floating gate through the tunneling oxide, thereby lowering the threshold voltage of the memory cells within the selected block. In some cases, an erase operation may be performed on an entire memory plane, on individual blocks within a memory plane, or another unit of cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

Figure 3B:
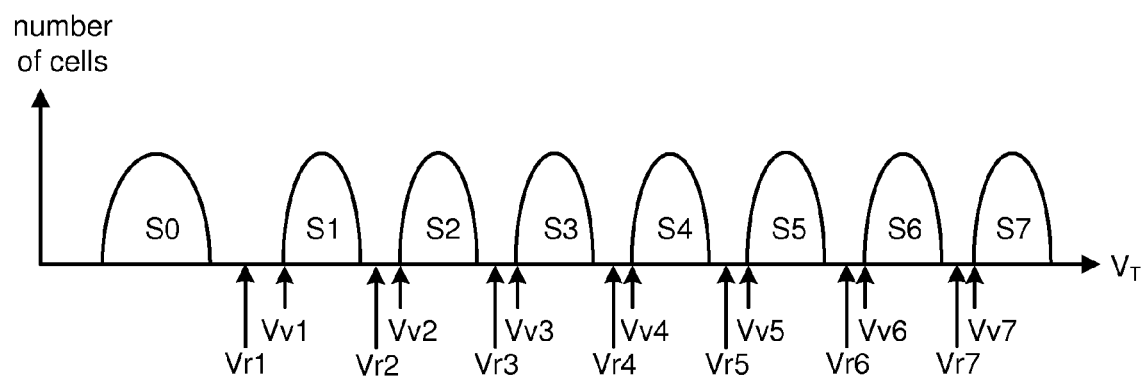
FIG. 3B depicts one embodiment of possible threshold voltage distributions for a three-bit-per-cell memory cell.

FIG. 3B depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 4:
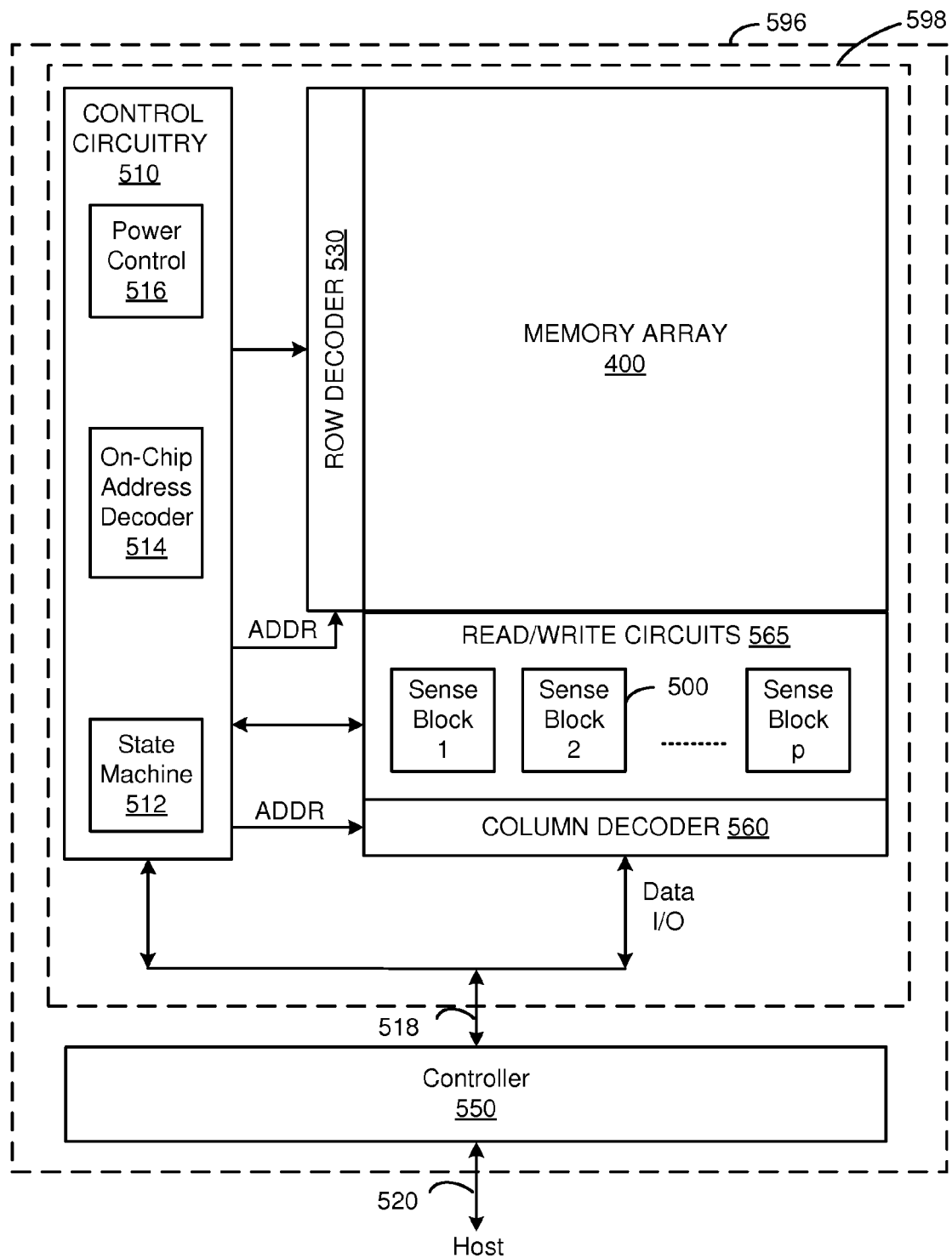
FIG. 4 depicts one embodiment of a non-volatile storage system.

FIG. 4 depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 400 (e.g., a NAND flash memory array), control circuitry 510, row decoder 530, column decoder 560, and read/write circuits 565. In one embodiment, access to the memory array 400 by the various peripheral circuits (e.g., row decoders or column decoders) is implemented in a symmetric fashion, on opposite sides of the array, so that the densities of access lines and circuitry on each side are reduced by half. The memory array 400 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

The control circuitry 510 cooperates with the read/write circuits 565 to perform memory operations on the memory array 400. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations. In one embodiment, a power control module 516 includes one or more charge pumps that can create voltages larger than the supply voltage.

In some embodiments, one or more of the components (alone or in combination), other than memory array 400, may be referred to as a managing or control circuit. For example, one or more managing or control circuits may include any one of or a combination of control circuitry 510, state machine 512, decoders 530/560, power control 516, sense blocks 500, read/write circuits 565, controller 550, and so forth. The one or more managing circuits may perform or facilitate one or more memory array operations including erasing, programming, or reading operations.

In one embodiment, memory array 400 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 5:
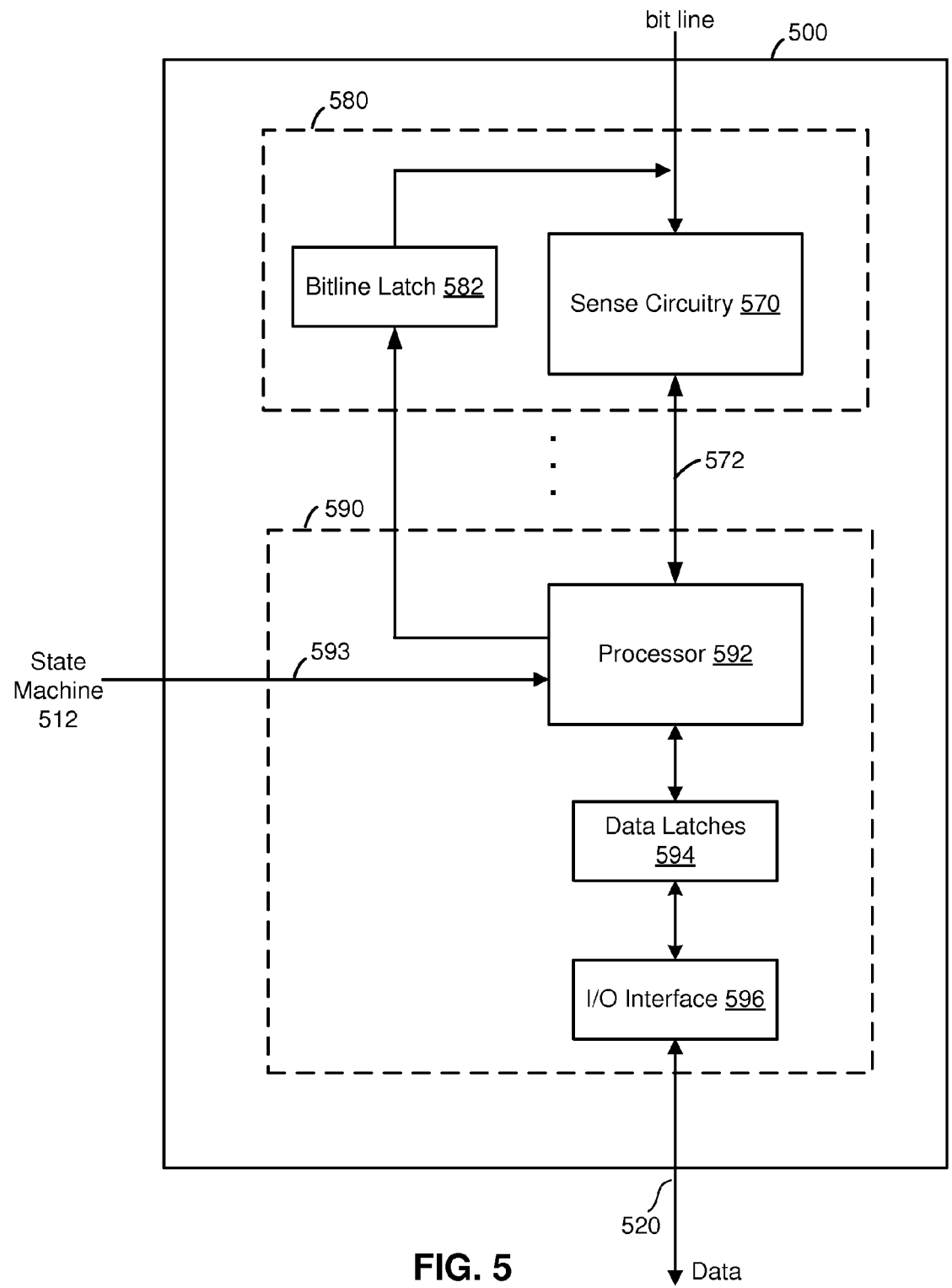
FIG. 5 depicts one embodiment of a sense block.

FIG. 5 depicts one embodiment of a sense block 500, such as sense block 500 in FIG. 4. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 400 in FIG. 4. I/O interface 596 provides an interface between data latches 594 and the data bus 520.

During a read operation or other storage element sensing operation, a state machine, such as state machine 512 in FIG. 4, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 6A:
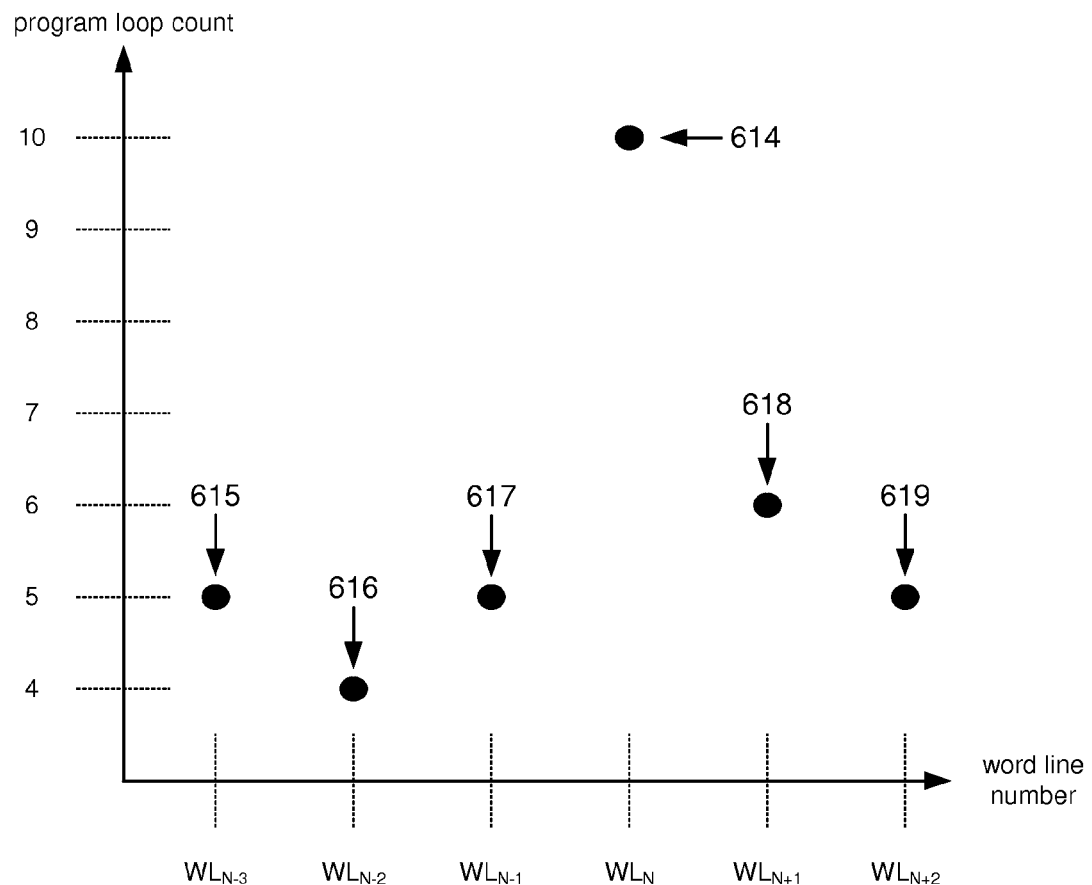
FIG. 6A depicts one embodiment of a chart showing a number of programming loop counts over a range of word lines.

FIG. 6A depicts one embodiment of a chart showing a number of programming loop counts 614-619 over a range of word lines. The word lines include word line $WL_{N-3}$ through word line $WL_{N+2}$. The word lines may comprise a group of word lines in a memory array. Word line $WL_N$ may be positioned adjacent to word lines $WL_{N-1}$ and $WL_{N+1}$ in the memory array. As depicted, the programming loop count 615 for word line $WL_{N-3}$ is 5, the programming loop count 616 for word line $WL_{N-2}$ is 4, the programming loop count 617 for word line $WL_{N-1}$ is 5, the programming loop count 614 for word line $WL_N$ is 10, the programming loop count 618 for word line $WL_{N+1}$ is 6, and the programming loop count 619 for word line $WL_{N+2}$ is 5. In one embodiment, a baseline programming loop count may comprise an average programming loop count for the last two word lines programmed during a programming operation. In the case that word lines $WL_{N-2}$ and $WL_{N-1}$ were the last two word lines programmed prior to programming $WL_N$, then the baseline programming loop count would be 4.5.

Figure 6B:
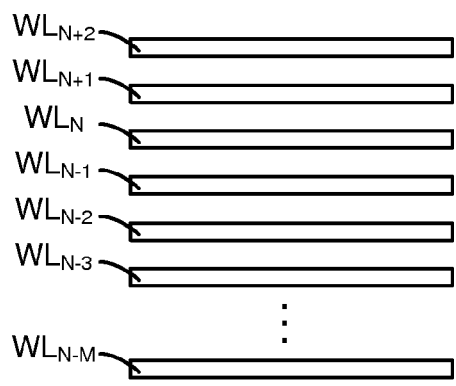
FIG. 6B depicts one embodiment of an arrangement of word lines in a memory array.

FIG. 6B depicts one embodiment of an arrangement of word lines in a memory array. The word lines include word line $WL_{N-M}$ through word line $WL_{N+2}$. The word lines may comprise a set of physically adjacent word lines in a memory array. In one embodiment, during a programming operation, the word lines below a particular word line may be programmed prior to programming the particular word line. For example, word line $WL_{N-2}$ may be programmed prior to word line $WL_{N-1}$ being programmed, and word line $WL_{N-1}$ may be programmed prior to word line $WL_N$ being programmed. In some cases, odd numbered word lines (e.g., $WL_{N-1}$ and $WL_{N+1}$) may be programmed apart from even numbered word lines (e.g., $WL_{N-2}$ and $WL_{N+2}$). In this case, word line $WL_{N-3}$ may be programmed prior to word line $WL_{N-1}$ being programmed, and word line $WL_{N-1}$ may be programmed prior to word line $WL_{N+1}$ being programmed. In one embodiment, a baseline programming loop count may comprise an average programming loop count for the last two word lines programmed during a programming operation. In the case that word lines $WL_{N-3}$ and $WL_{N-1}$ were the last two word lines programmed prior to programming $WL_{N+1}$, then the baseline programming loop count would be 5.0. In another embodiment, a baseline programming loop count may comprise an average programming loop count for the last three word lines programmed during a programming operation. In the case that word lines $WL_{N-3}$, $WL_{N-2}$, and $WL_{N-1}$ were the last three word lines programmed prior to programming $WL_N$, then the baseline programming loop count would be 4.67.

Figure 6C:
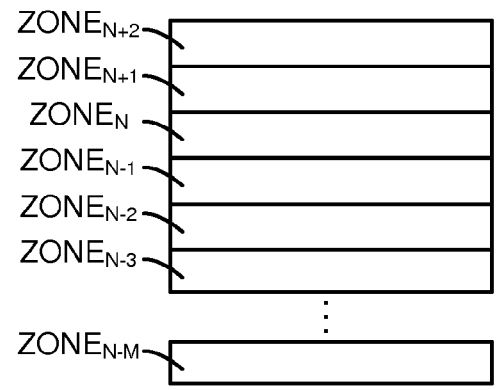
FIG. 6C depicts one embodiment of an arrangement of a plurality of memory zones in a memory array.

FIG. 6C depicts one embodiment of an arrangement of a plurality of memory zones in a memory array. Each zone of the plurality of memory zones may correspond with a region within the memory array associated with one or more word lines. The memory zones include memory zone $ZONE_{N-M}$ through memory zone $ZONE_{N+2}$. In one example, each memory zone may comprise a set of 32 word lines. In another example, each memory zone may comprise a set of 128 word lines. In one embodiment, a baseline erase loop count may comprise an average erase loop count for the last two memory zones erased during an erase operation. In one embodiment, a baseline erase loop count may comprise an average erase loop count for the last four memory zones erased during an erase operation.

Figure 7A:
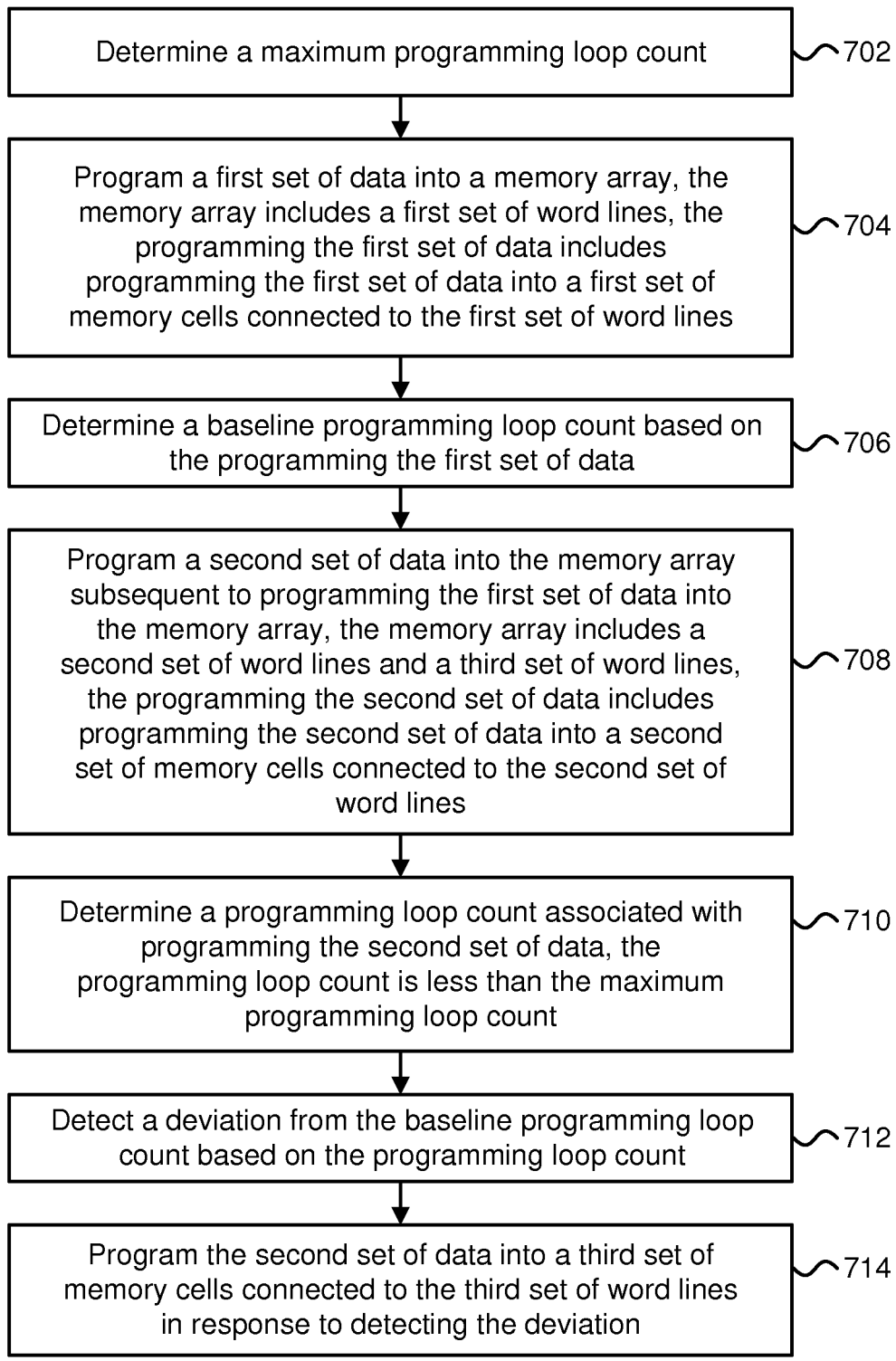
FIG. 7A is a flowchart describing one embodiment of a process for detecting and correcting defects in a memory array.

FIG. 7A is a flowchart describing one embodiment of a process for detecting and correcting defects in a memory array. In one embodiment, the process of FIG. 7A may be performed by a non-volatile storage system, such as non-volatile storage system 596 in FIG. 4.

In step 702, a maximum programming loop count is determined. The maximum programming loop count may be set in order to detect hard word line failures. The maximum programming loop count may be set prior to product shipment to customers. In step 704, a first set of data is programmed into a memory array. The memory array may comprise a NAND memory array, a 3D NAND memory array (e.g., a bit cost scalable (BiCS) NAND structure), or a three-dimensional memory array (e.g., a 3D ReRAM memory array). The memory array includes a first set of word lines. In one example, the first set of word lines may comprise a single word line. In another example, the first set of word lines may comprise a plurality of word lines, such as four word lines. The programming the first set of data into the memory array may include programming the first set of data into a first set of memory cells connected to the first set of word lines.

In step 706, a baseline programming loop count is determined based on the programming the first set of data. In one embodiment, the baseline programming loop count may comprise an average programming loop count for the last two word lines programmed during a programming operation. In another embodiment, the baseline programming loop count may comprise an average programming loop count for the last eight word lines programmed during a programming operation. In some cases, the last eight word lines programmed during a programming operation may correspond with odd numbered word lines in the memory array. In other cases, the last eight word lines programmed during a programming operation may correspond with both odd and even numbered word lines in the memory array. In some cases, the baseline programming loop count may comprise a cumulative moving average over the last one or more word lines programmed during a programming operation.

In step 708, a second set of data is programmed into the memory array subsequent to programming the first set of data into the memory array. The memory array includes a second set of word lines and a third set of word lines. In one example, the second set of word lines may comprise a single word line. In another example, the second set of word lines may comprise a plurality of word lines, such as four word lines. The programming the second set of data may include programming the second set of data into a second set of memory cells connected to the second set of word lines.

In step 710, a programming loop count associated with programming the second set of data is determined. In some cases, the programming loop count may be less than the maximum programming loop count. The programming loop count associated with programming the second set of data may comprise a number of program/verify cycles required to program the second set of data into the memory cells connected to the second set of word lines.

In step 712, a deviation from the baseline programming loop count is detected based on the programming loop count. The deviation from the baseline programming loop count may be detected by comparing the baseline programming loop count with the programming loop count associated with programming the second set of data. In one embodiment, if the programming loop count exceeds or is greater than the baseline programming loop count by at least a threshold number of programming loops (e.g., the programming loop count exceeds the baseline programming loop count by at least five programming loops), then the deviation may be detected.

In step 714, the second set of data is programmed into a third set of memory cells connected to the third set of word lines in response to detecting the deviation. In some cases, once a deviation has been detected, then the second set of word lines may be marked as defective and the data being programmed into the second set of word lines may be programmed into to a different set of word lines.

In some embodiments, the baseline programming loop count that is used for detecting deviations in program/verify cycles may vary depending on a particular word line being programmed and the number of program/verify cycles that were required by other word lines that were programmed prior to programming the particular word line. Thus, in some cases, the baseline programming loop count for a first word line in a memory array may be different from the baseline programming loop count for a second word line in the memory array.

Figure 7B:
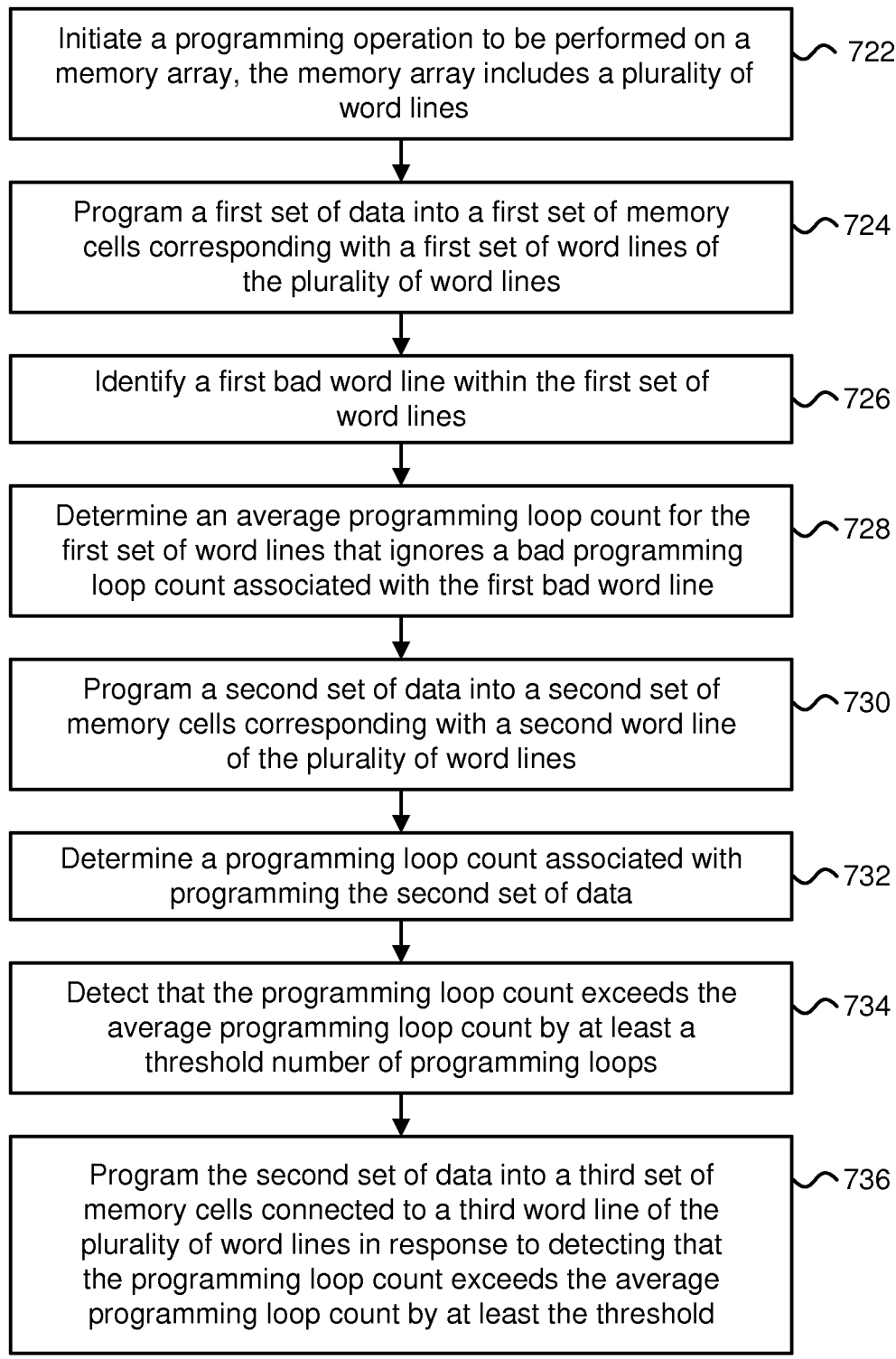
FIG. 7B is a flowchart describing another embodiment of a process for detecting and correcting defects in a memory array.

FIG. 7B is a flowchart describing another embodiment of a process for detecting and correcting defects in a memory array. In one embodiment, the process of FIG. 7B may be performed by a non-volatile storage system, such as non-volatile storage system 596 in FIG. 4.

In step 722, a programming operation to be performed on a memory array is initiated. In one embodiment, the programming operation may comprise a SET or RESET operation. In some cases, a SET operation may comprise setting one or more memory cells into a low resistance state. In some cases, a RESET operation may comprise setting one or more memory cells into a high resistance state. In another embodiment, the programming operation may comprise adjusting a threshold voltage of a floating gate transistor. The memory array may include a plurality of word lines and a plurality of bit lines. In step 724, a first set of data is programmed into a first set of memory cells corresponding with a first set of word lines of the plurality of word lines. In step 726, a first bad word line within the first set of word lines is identified. In one embodiment, the first bad word line may be identified as being a bad word line based on a programming loop count associated with the bad word line exceeding a baseline programming loop count by a threshold number of program/verify cycles. In another embodiment, the first bad word line may be identified as being a bad word line based on a programming loop count associated with the bad word line exceeding a maximum programming loop count. The first bad word line may comprise a defective word line or a word line that has been marked or flagged as comprising a defective word line.

In step 728, an average programming loop count for the first set of word lines is determined. In some cases, the average programming loop count for the first set of word lines may ignore a bad programming loop count associated with the first bad word line. Thus, bad programming loop counts for bad word lines within the first set of word lines may be ignored or excluded from contributing to the average programming loop count for the first set of word lines.

In step 730, a second set of data is programmed into a second set of memory cells corresponding with a second word line of the plurality of word lines. In step 732, a programming loop count associated with programming the second set of data is determined. In one embodiment, the programming loop count may correspond with a number of program/verify cycles required for programming the second set of data into the second set of memory cells. In step 734, it is determined or detected that the programming loop count exceeds the average programming loop count by at least a threshold number of programming loops. In one example, it may be detected that the programming loop count has exceeded the average programming loop count by an additional five program/verify cycles. In step 736, the second set of data is programmed into a third set of memory cells connected to a third word line of the plurality of word lines in response to detecting that the programming loop count exceeds the average programming loop count by at least a threshold. In some cases, once a deviation has been detected, then the second set of word lines may be marked as defective and the data being programmed into the second set of word lines may be programmed into to a different set of word lines. For example, the second set of word lines may be programmed into a different set of word lines within the memory array.

Figure 8:
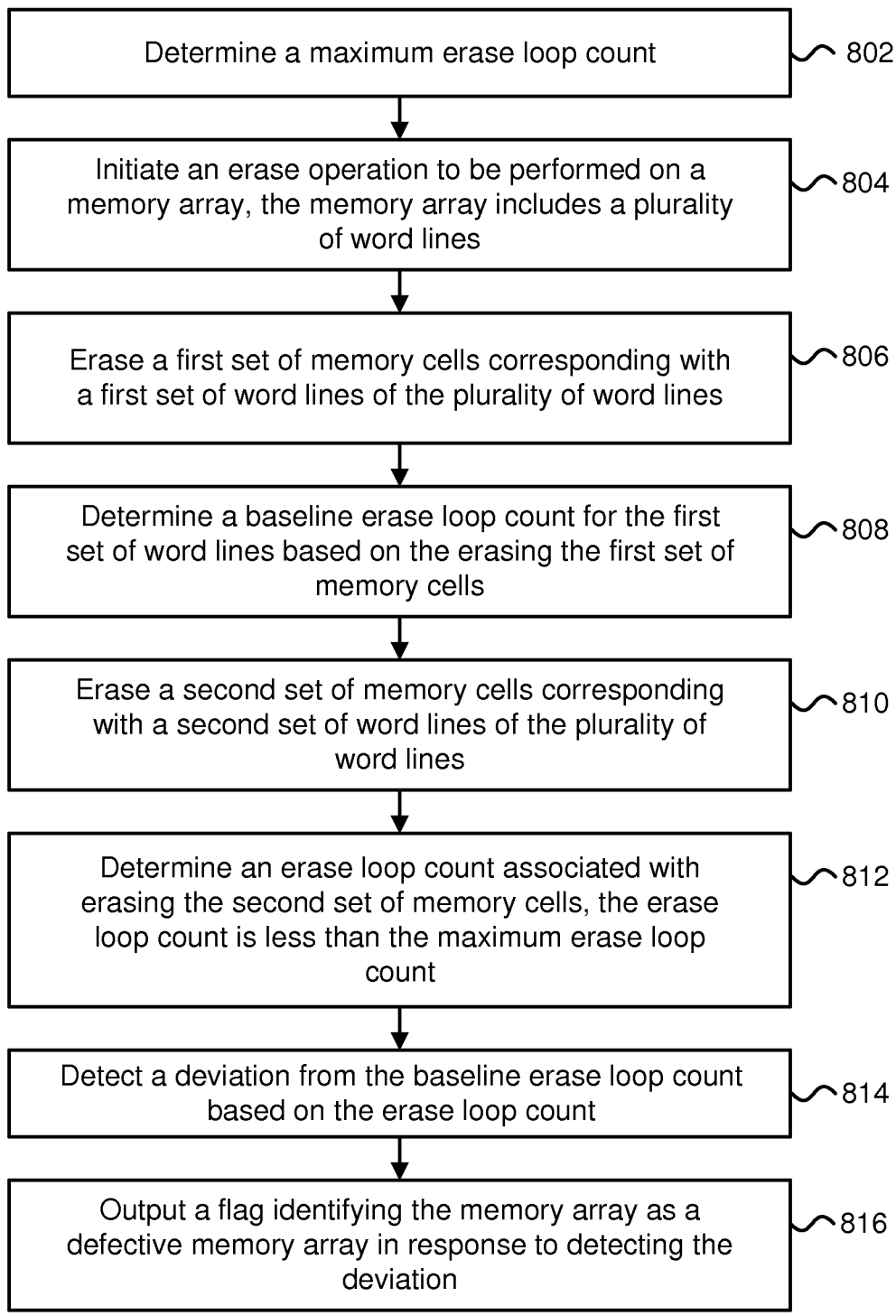
FIG. 8 is a flowchart describing an alternative embodiment of a process for detecting and correcting defects in a memory array.

FIG. 8 is a flowchart describing an alternative embodiment of a process for detecting and correcting defects in a memory array. In one embodiment, the process of FIG. 8 may be performed by a non-volatile storage system, such as non-volatile storage system 596 in FIG. 4.

In step 802, a maximum erase loop count is determined. The maximum erase loop count may be set in order to detect hard zone failures. The maximum erase loop count may be set prior to product shipment to customers. In step 804, an erase operation to be performed on a memory array is initiated. The memory array may comprise a NAND memory array, a 3D NAND memory array (e.g., a bit cost scalable (BiCS) NAND structure), or a three-dimensional memory array (e.g., a 3D ReRAM memory array). The memory array includes a plurality of word lines.

In step 806, a first set of memory cells corresponding with a first set of word lines of the plurality of word lines is erased. In one example, the first set of word lines may comprise a single word line. In another example, the first set of word lines may comprise a plurality of word lines, such as 64 or 128 word lines.

In step 808, a baseline erase loop count for the first set of word lines is determined based on the erasing the first set of memory cells. In one embodiment, the baseline erase loop count may comprise an average erase loop count for the last two memory zones erased during an erase operation. In another embodiment, the baseline erase loop count may comprise an average erase loop count over the last one or more memory zones erased during an erase operation.

In step 810, a second set of memory cells corresponding with a second set of word lines of the plurality of word lines is erased. In step 812, an erase loop count associated with erasing the second set of memory cells is determined. In some cases, the erase loop count may be less than the maximum erase loop count. The erase loop count associated with erasing the second set of memory cells may comprise a number of erase/verify cycles required to erase the second set of memory cells.

In step 814, a deviation from the baseline erase loop count is detected based on the erase loop count. The deviation from the baseline erase loop count may be detected by comparing the baseline erase loop count with the erase loop count associated with erasing the second set of memory cells. In one embodiment, if the erase loop count exceeds or is greater than the baseline erase loop count by at least a threshold number of erase/verify cycles (e.g., the erase loop count exceeds the baseline erase loop count by at least five erase/verify cycles), then the deviation may be detected. In step 816, a flag identifying the memory array as a defective memory array is outputted in response to detecting the deviation.

In some embodiments, the baseline erase loop count that is used for detecting deviations in erase/verify cycles may vary depending on a particular memory zone being erased and the number of erase/verify cycles that were required by other memory zones that were erased prior to erasing the particular memory zone. Thus, in some cases, the baseline erase loop count for a first memory zone within a memory array may be different from the baseline erase loop count for a second memory zone within the memory array.

One embodiment of the disclosed technology includes programming a first set of data into a memory array. The memory array includes a first set of word lines. The programming a first set of data includes programming the first set of data into a first set of memory cells connected to the first set of word lines. The method further comprises determining a baseline programming loop count based on programming the first set of data into the first set of memory cells and programming a second set of data into the memory array subsequent to the programming a first set of data. The memory array includes a second set of word lines and a third set of word lines. The programming a second set of data includes programming the second set of data into a second set of memory cells connected to the second set of word lines. The method further comprises determining a programming loop count associated with programming the second set of data into the second set of memory cells, detecting a deviation from the baseline programming loop count based on the programming loop count, and programming the second set of data into a third set of memory cells connected to the third set of word lines in response to detecting the deviation.

One embodiment of the disclosed technology includes a non-volatile storage system including a memory array and one or more managing circuits in communication with the memory array. The memory array includes a first set of word lines and a second set of word lines. The one or more managing circuits configured to program a first set of data into a first set of memory cells connected to the first set of word lines, configured to determine a baseline programming loop count based on programming the first set of data into the first set of memory cells, configured to program a second set of data into a second set of memory cells connected to the second set of word lines subsequent to programming the first set of data into the first set of memory cells, configured to determine a programming loop count associated with programming the second set of data into the second set of memory cells, configured to detect a deviation from the baseline programming loop count based on the programming loop count, and configured to program the second set of data into a third set of memory cells connected to a third set of word lines in response to detecting the deviation.

One embodiment of the disclosed technology includes initiating an erase operation to be performed on a memory array. The memory array includes a plurality of word lines. The method further comprises erasing a first set of memory cells corresponding with a first set of word lines of the plurality of word lines, determining a baseline erase loop count associated with the erasing the first set of memory cells, erasing a second set of memory cells corresponding with a second set of word lines of the plurality of word lines, determining an erase loop count associated with erasing the second set of memory cells, detecting a deviation from the baseline erase loop count based on the erase loop count, and outputting an indication that the memory array is a defective memory array in response to detecting the deviation.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method, comprising:
 programming a first set of data into a memory array, the memory array includes a first set of word lines, the programming a first set of data includes programming the first set of data into a first set of memory cells connected to the first set of word lines;
 determining a baseline programming loop count based on programming the first set of data into the first set of memory cells;
 programming a second set of data into the memory array subsequent to the programming a first set of data, the memory array includes a second set of word lines and a third set of word lines, the programming a second set of data includes programming the second set of data into a second set of memory cells connected to the second set of word lines;
 determining a programming loop count associated with programming the second set of data into the second set of memory cells;
 detecting a deviation from the baseline programming loop count based on the programming loop count, the detecting a deviation from the baseline programming loop count includes detecting that the programming loop count is greater than the baseline programming loop count by at least a threshold number of program/verify cycles; and
 programming the second set of data into a third set of memory cells connected to the third set of word lines in response to detecting the deviation.

2. The method of claim 1, wherein:
 the programming loop count is less than a maximum programming loop count associated with detecting a hard word line failure.

3. The method of claim 1, wherein:
 the determining a baseline programming loop count includes determining an average number of program/verify cycles per word line for the first set of word lines.

4. The method of claim 1, wherein:
 the first set of word lines comprises a first word line;
 the second set of word lines comprises a second word line adjacent to the first word line; and
 the determining a baseline programming loop count includes determining a number of program/verify cycles for programming the first set of data into the first set of memory cells connected to the first word line.

5. The method of claim 1, further comprising:
 identifying a first defective word line within the first set of word lines; and
 the determining a baseline programming loop count includes determining an average programming loop count for the first set of word lines that excludes a defective programming loop count associated with the first defective word line.

6. The method of claim 1, wherein:
 the programming loop count comprises a number of program/verify cycles that were required to program the second set of data into the second set of memory cells.

7. The method of claim 1, further comprising:
 acquiring a maximum programming loop count, the programming loop count is less than the maximum programming loop count; and
 outputting an indication that the second set of memory cells connected to the second set of word lines is defective.

8. The method of claim 1, wherein:
 the first set of word lines comprises a set of one or more odd numbered word lines that were programmed prior to programming the second set of data into the second set of memory cells.

9. The method of claim 1, further comprising:
 determining a number of erase cycles that have occurred to the second set of memory cells connected to the second set of word lines; and
 setting the threshold number of program/verify cycles based on the number of erase cycles.

10. The method of claim 1, wherein:

the detecting a deviation from the baseline programming loop count includes detecting the deviation during a programming operation in the field.

11. The method of claim 1, wherein:

the memory array comprises a non-volatile memory that is monolithically formed in one or more physical levels of memory cells having active areas disposed above a silicon substrate, the non-volatile storage system includes circuitry associated with the operation of the memory array.

12. The method of claim 1, wherein:

the memory array comprises a three-dimensional memory array;

the first set of word lines comprises a plurality of word lines; and the second set of word lines comprises a single word line.

13. A system, comprising:

a memory array, the memory array includes a first set of word lines and a second set of word lines; and one or more managing circuits in communication with the memory array, the one or more managing circuits configured to program a first set of data into a first set of memory cells connected to the first set of word lines, the one or more managing circuits configured to determine a baseline programming loop count based on programming the first set of data into the first set of memory cells, the one or more managing circuits configured to program a second set of data into a second set of memory cells connected to the second set of word lines subsequent to programming the first set of data into the first set of memory cells, the one or more managing circuits configured to determine a programming loop count associated with programming the second set of data into the second set of memory cells, the one or more managing circuits configured to detect a deviation from the baseline programming loop count based on the programming loop count, the one or more managing circuits configured to program the second set of data into a third set of memory cells connected to a third set of word lines in response to detecting the deviation, the one or more managing circuits configured to detect the deviation if the programming loop count is greater than the baseline programming loop count by at least a threshold number of program/verify cycles.

14. The system of claim 13, wherein:

the threshold number of program/verify cycles is set based on a number of erase cycles that have occurred to the second set of memory cells connected to the second set of word lines.

15. The system of claim 13, wherein:

the one or more managing circuits configured to determine an average number of program/verify cycles per word line for the first set of word lines, the one or more managing circuits configured to determine the baseline programming loop count based on the average number of program/verify cycles per word line for the first set of word lines.

16. The system of claim 13, wherein:

the first set of word lines comprises a first word line;

the second set of word lines comprises a second word line adjacent to the first word line; and the one or more managing circuits configured to determine a number of program/verify cycles for programming the first set of data into the first set of memory cells connected to the first word line, the one or more managing circuits configured to determine the baseline programming loop count based on the number of program/verify cycles for programming the first set of data into the first set of memory cells connected to the first word line.

17. The system of claim 13, wherein:

the memory array comprises a three-dimensional memory array.

18. An apparatus, comprising:

a memory array including a first word line and a second word line; and a control circuit configured determine a baseline programming loop count for programming a first set of data into memory cells of the first word line and determine a programming loop count associated with programming a second set of data into memory cells of the second word line, the control circuit configured to program the second set of data into a third set of memory cells in response to detecting that the programming loop count is greater than the baseline programming loop count by at least a threshold number of program/verify cycles.

19. The apparatus of claim 18, wherein:

the programming loop count is less than a maximum programming loop count associated with detecting a hard word line failure for the second word line.

20. The apparatus of claim 18, wherein:

the control circuit sets the threshold number of program/verify cycles based on a number of erase cycles that have occurred to the second set of memory cells.

\* \* \* \* \*